Figure 5:
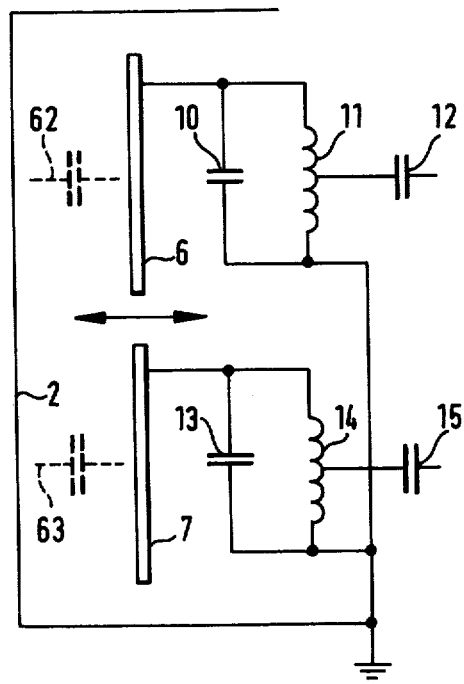

United States Patent [19]  
Kraus

[11] 4,240,528  
[45] Dec. 23, 1980

[54] FIELD SENSOR

[75] Inventor: Hans Kraus, Rüsselheim, Fed. Rep. of Germany

[73] Assignee: Maschinenfabrik Augsburg-Nuernberg Aktiengesellschaft, Nuremberg, Fed. Rep. of Germany

[21] Appl. No.: 902,735

[22] Filed: May 24, 1978

[30] Foreign Application Priority Data

May 4, 1979 [DE] Fed. Rep. of Germany ....... 2719955

[51] Int. Cl.³ .............................................. B66B 13/06
[52] U.S. Cl. .................................. 187/52 R; 187/56; 340/562
[58] Field of Search .................... 187/48, 52 R, 56; 340/562

[56] References Cited

U.S. PATENT DOCUMENTS

| 2,720,284 | 10/1955 | Galanty | 187/48 |
| 3,018,851 | 1/1962 | Diamond | 187/48 |
| 3,370,677 | 2/1968 | Federmann | 187/56 |

Primary Examiner—John P. Silverstrim  
Attorney, Agent, or Firm—Karl H. Gross

[57] ABSTRACT

A field sensor control mechanism for doors and the like has two or more insulated electrodes mounted at different levels in the leading edge of a door or the like. A first oscillating circuit is connected with one of these electrodes and a second oscillating circuit, separate from the first one and serving as a comparison circuit for the same, is connected to the other electrode. The two circuits have base oscillating frequencies which are either identical or differ only slightly from one another. The circuits are so coupled to one another that the oscillations of the first circuit vary as a function of capacitance changes taking place in the electrodes.

10 Claims, 14 Drawing Figures

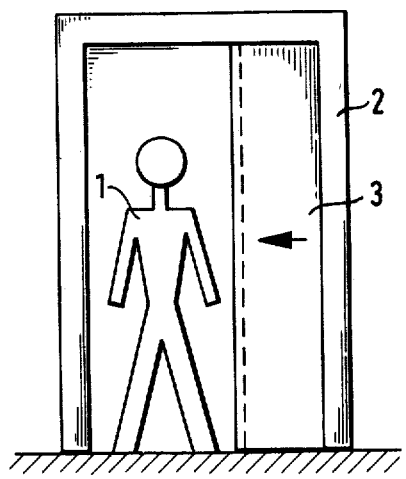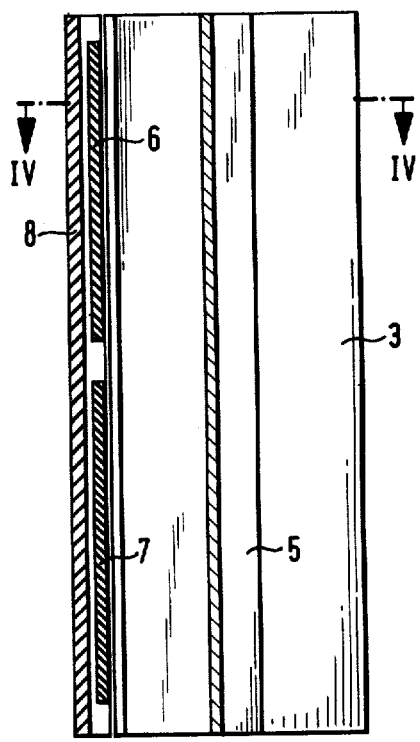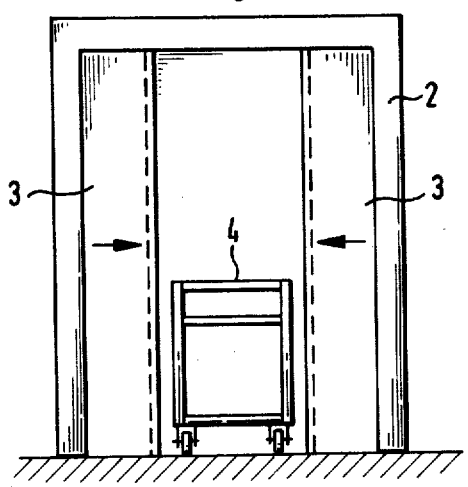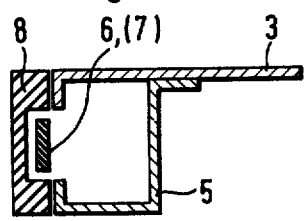

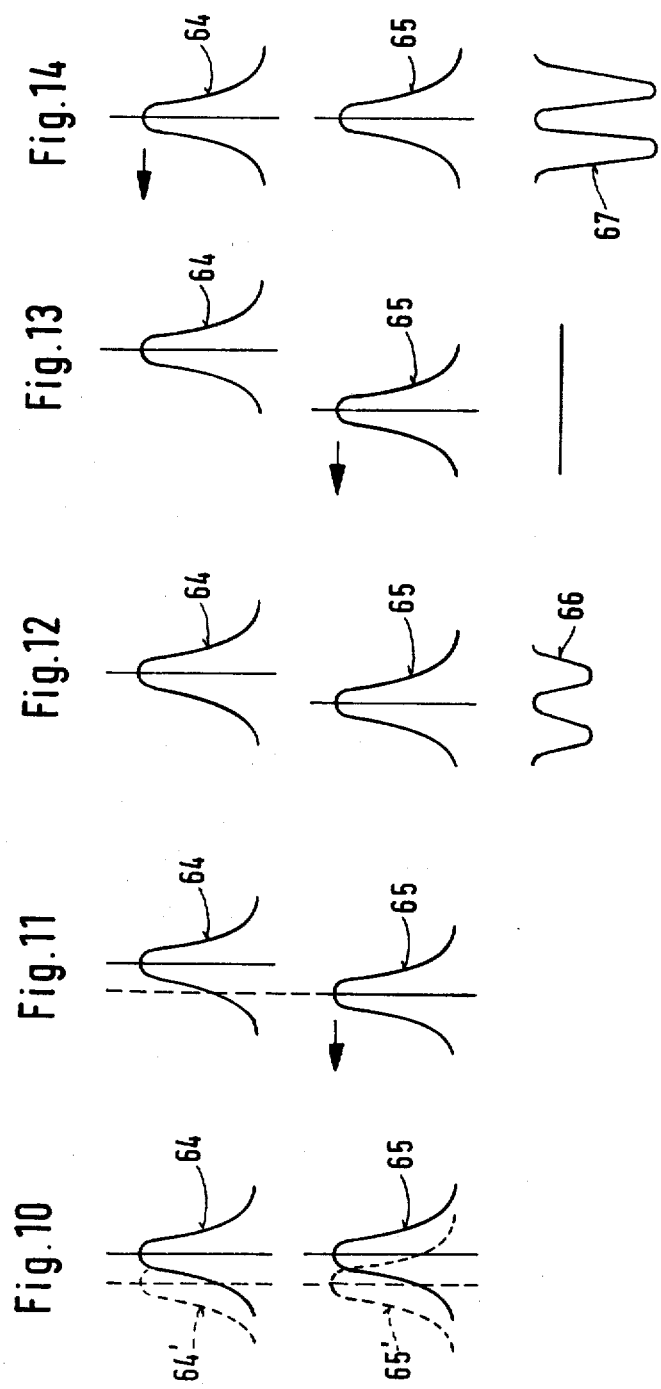

FIELD SENSOR

This invention relates to a field sensor for detecting persons or objects in front of linearly moving motor-operated edges, typically the leading edges of sliding-type elevator doors.

In the case of linearly-moving motor-operated and automatically-controlled edges, typically on sliding doors, it was a frequent occurrence that a person or a transport truck stood in the door frame as the sliding door started to close. Even where suitable safeguards were installed which prevented accidents from happening, it invariably took a certain period of time in such cases until the sliding door moved back into its open position and thereby released the object caught in the door and until it eventually closed again.

Photocells which are generally installed at present suffer from a drawback in that, for instance, when a sliding door is already almost completely closed will open again fully on an object being detected and only after appropriate switching action will the closing operation be started again whereby a substantial loss of time is incurred which, considering the high traffic density of today's elevator installations, is no longer acceptable. Another disadvantage of photocells is in the fact that they will detect an obstruction only when it is at the same level with them.

It is the object of the present invention to provide a device or field sensor which permits reliable detection of an obstruction by electrical non-contacting means to stop the moving edge or sliding door in good time and, if necessary, causes it to recede somewhat without it being necessary to move into its extreme end position.

According to the invention, this problem is solved in a manner that at least two insulated electrodes are provided in the movable edge, that these electrodes each influences a similarly constructed oscillatory circuit, and that the two oscillatory circuits together are connected with an amplifier and a special feedback coil to the base oscillatory circuit inductance with an adjustable feedback resistance and form an oscillator which after tuning of the oscillatory circuits by means of an adjustable capacitor to a suitable frequency and minimum feedback will oscillate when the electrodes are not influenced or are symmetrically influenced whereas the oscillations will cease when the electrodes are unsymmetrically influenced.

This provides a complete solution to the problem on which the invention is based. The device will operate reliably and positively detect any obstruction existing in front of the moving edge in good time with the size of the obstruction being of no importance.

With a view to reducing interference radiation and to prevent interference with, say, cardiac pace-makers, it is proposed to operate the oscillator with such a low level of power that an additional amplifier is necessary for the further processing of the oscillations, This amplifier has two rectifier circuits connected at the output of which the one produces the positive and the other negative d.c. voltage which are then applied to a further amplifier.

The two oscillatory circuits each consist of a capacitor and an inductance. They are tuned for the same frequency and switching criteria are that they will oscillate when the electrodes are not influenced or are symmetrically influenced and will not oscillate when the electrodes are unsymmetrically influenced.

Furthermore, it is proposed according to the invention that both oscillatory circuits are operated with a slight detuning to increase the switching sensitivity, the switching criteria used with unsymmetrical influence being the non-oscillating condition or the increased amplitude condition.

Finally, it is proposed according to the invention that the switching point for actuation and the switching point for re-energizing to mark the end of the opening movement of the door can be defined by appropriate proportioning of resistance.

For further details of the invention reference is made to the description hereunder of a typical embodiment which is illustrated in the drawing in which FIG. 1 shows a door sliding to one side with a person interposed in the doorway, FIG. 2 shows a two-leaf centre opening sliding door with a transport truck standing between its door leaves, FIG. 3 shows the leading edge of a door leaf with one part of the device according to the invention sectioned, FIG. 4 shows a section IV—IV through the part view in FIG. 3 enlarged, FIG. 5 shows the physical principle of the field sensor according to the invention.

Figure 6:
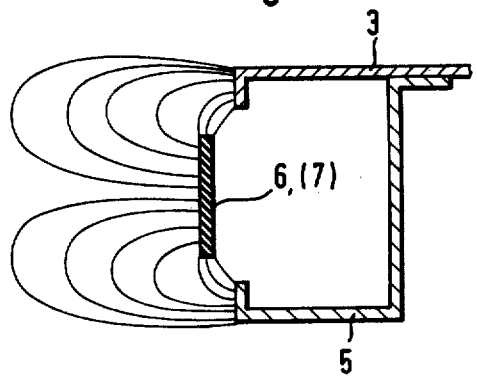
Figure 7:
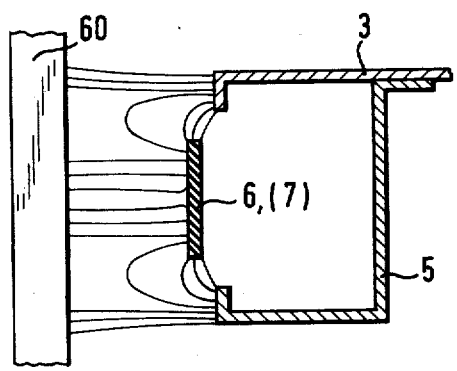
Figure 8:
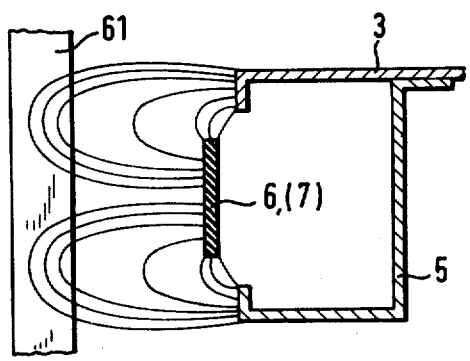
Figure 9:
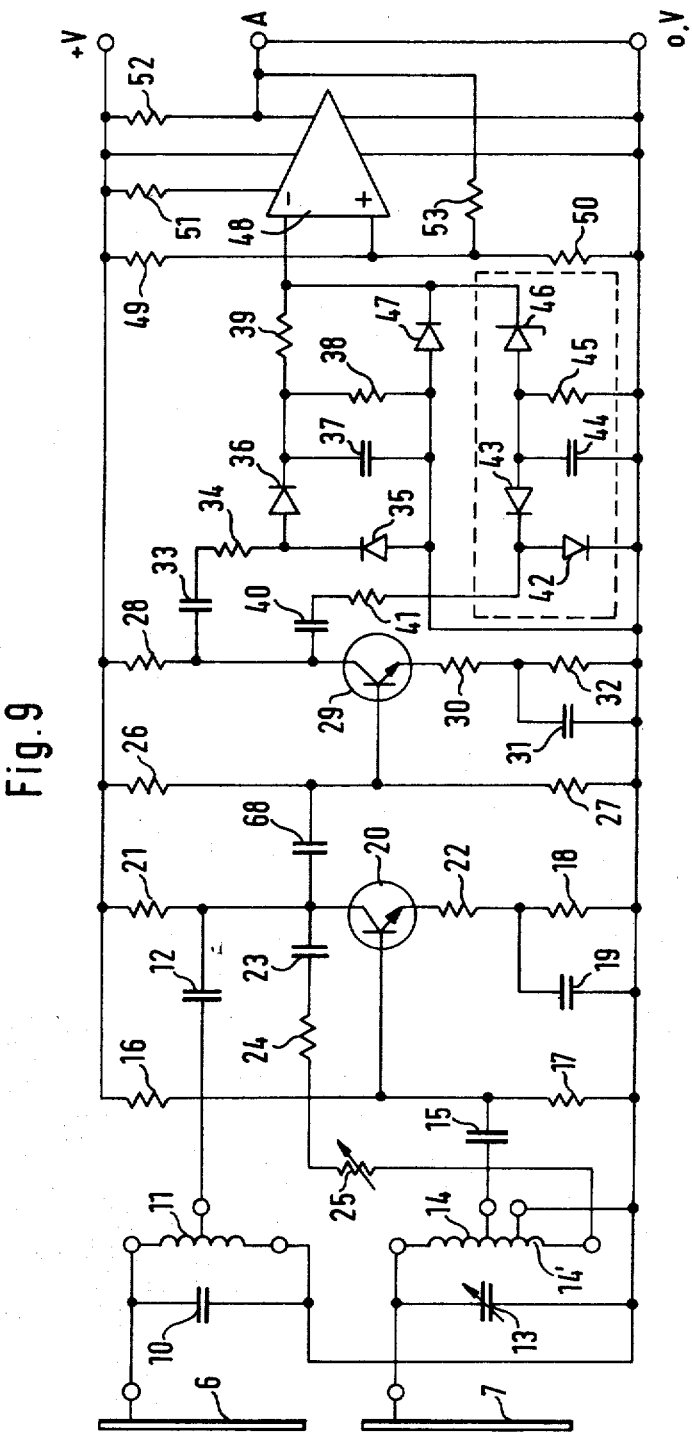

FIGS. 6 to 8 show the change of the field lines triggering the switching operation as the leading edge of a sliding door approaches various objects, FIG. 9 is a circuit diagram showing the complete arrangement according to the invention, FIGS. 10 to 14 are various resonance curves such as may arise when the device is operated.

In FIG. 1, a person 1 which is only shown schematically is moving through the door frame 2 of a single leaf sliding door 3 arranged to slide to one side and already partly closed. In this situation, the field sensor will already respond.

The same applies to the case illustrated in FIG. 2 where both door leaves of the sliding door 3 have been stopped in their closing motion by the transport truck 4 positioned between them. It is considered to be axiomatic that the frame 2 and the sliding doors 3 consist of metal and are grounded in conformance with the regulations.

According to FIGS. 3 and 4, the leading edge of the sliding door 3 is provided with a frame 5 in which two insulated electrodes 6, 7 of equal length are installed. The leading edge of the sliding door 3 itself is formed with a cover 8 consisting of insulating material.

In FIG. 5 the grounded door frame 2 is only shown schematically. The electrodes 6, 7 are situated in the sliding door which is not shown. The upper electrode 6 is connected with an oscillatory circuit formed by a capacitor 10 and an inductance 11, while the lower electrode 7 is connected with a second oscillatory circuit formed by a capacitor 13 and an inductance 14. Two capacitors 12 and 15 are transposing capacitors and serve only for the purpose of galvanic isolation. Finally, the electrodes 6, 7 relative to the door frame 2 form capacitors which are designated 62 and 63 and indicated only by dashed lines. The capacitor 62 is connected in parallel with the capacitor 10 and the capacitor 62 in parallel with capacitor 13.

The two oscillatory circuits described are tuned for the same frequency. On account of the movement of the sliding door 3, the capacitance of the capacitors 62, 63 formed by the electrodes 6, 7 relative to the grounded door frame 2 will vary steadily. Consequently, the frequency of the two oscillatory circuits will be varied accordingly. However, since this change in the two oscillatory circuits will be on a symmetrical pattern, no switching operation will be initiated. If, however, a person 1, a transport truck 4 or similar object is positioned in front of an electrode 6 or 7, this will cause a change in capacitance and, thereby, a change in frequency of the associated oscillatory circuit. Such an asymmetric change of the oscillatory circuit frequencies will cause a discontinuation of the oscillator oscillations and thereby will initiate a switching operation. The effect initiating a switching operation on the leading edge of the sliding door 3 approaching a person or an object relies on the change in capacitance of the capacitors 62, 63 formed by the sliding door 3 and the electrodes 6, 7 associated with the change in field line length.

FIG. 6 shows such an arrangement without interference while FIG. 7 shows interference by a conducting material 60 and FIG. 8 interference by an insulating material 61 with a higher dielectric constant than air or its insulating cover 8 (FIGS. 3 and 4). The distance between the leading edge of the sliding door 3 and the person 1 or another obstruction initiating a switching operation is adjustable over a range on account of the feedback effect of the oscillator circuit.

FIG. 9 shows the complete circuit arrangement which makes it possible to differentiate between symmetrical and non-symmetrical field changes between the electrodes 6, 7 and the door frame 2 or respectively in front of the electrodes 6, 7 and the leading edge of the sliding door 3. The electrode 6 is again connected with the oscillatory circuit formed by the capacitor 10 and the inductance 11, while the electrode 7 is connected to the oscillatory comparison circuit formed by the capacitor 13 and the inductance 14. The two systems are perfectly similar, both in the design of the electrodes 6, 7 and in the layout of the oscillatory circuits, except that capacitor 13 is of the variable type to compensate for manufacturing tolerances. The capacitor 13 is used to tune the frequency of the second oscillatory circuit to match that of the first oscillatory circuit. Connected between the two oscillatory circuits is an amplifier formed by elements 16 to 21 which are known per se. The resistors 16, 17 and 18 serve to adjust the working point, whereas the capacitor 19 shorts the resistor 18 for the a.c. current. A feedback resistor 22 serves to increase the input resistance of transistor 20 and, at the same time, makes the circuit system less sensitive to product variations. Apart from that, the amplifier is so dimensioned that only a very small current flows in it.

The tapping of the inductance 11 is connected via the capacitor 12 with the collector of transistor 20 and the tapping of the inductance 14 via the capacitor 15 with the base of the transistor 20.

The circuit system explained in conjunction with the ohmic feedback circuit consisting of the condenser 23, a resistor 24 and an adjustable resistor 25 and acting on the lower tapping of the inductance 14 forms an oscillator which is designed with 2 completely identical oscillatory circuits. The switching point of the system described can be varied as a function of the setting of the feedback by means of the adjustable resistor 25. For reasons of environmental emission of interference radiation, although a normal antenna effect will not occur at the frequency and electrode dimensions used and to avoid interference with, say, cardiac pace-makers, the oscillator operates with an extremely low power level. For this reason, further signal processing calls for the intermediate amplifier consisting of the elements 26 to 32. The intermediate amplifier 26 to 32 has two rectifier circuits connected at its output. The one rectifier circuit consists of the elements 33 to 39 and serves to produce a positive direct voltage, while the other rectifier circuit is formed by the elements 40 to 47 and serves to produce a negative direct voltage.

The alternating voltage obtained at the collector of the transistor 29 with the oscillator swinging is rectified by the switching elements 33 to 39 and applied to an amplifier 48. This amplifier 48 in the present example is a so-called OTA (operational transconductance amplifier) which is used as a programmable switch. The resistors 49, 50 and 53 enable the lower and upper switching threshold value and, consequently, the switching hysteresis, to be adjusted.

The resistance 53 is the load resistance of the amplifier 48, while the resistance 51 serves for readjustment of the working point. The output signal A for the subsequent control system which does not belong to the scope of the invention, will with the field sensor not activated, i.e. with the oscillator swinging, produce a zero (low) output signal and, with the field sensor activated, i.e. with the oscillator not swinging, an L (high) output signal.

Working principle:

A person 1 and an object 4 are detected by the electrode 6 or 7 within the switching range adjusted as the circuit formed by the elements 14', 16–22 and the sliding door 3 closes. The oscillator stops swinging. The level of the amplifier 48 falls below the lower threshold and the door control switches to opening. The leaving edge of the sliding door 3 with the electrodes 6 and 7 moves away from the person 1 or the obstruction 4, The oscillator will start swinging again. The amplitude will increase as the distance increases until the upper threshold of the amplifier 48 is exceeded. This will cause opening of the sliding door 3 to be stopped again. It is desirable by means of a time delay feature which is not explained here in detail to have the sliding door 3 stationary in this position for a short period whereupon a closing operation re-starts.

Basically, there are two different adjusting possibilities:

1st adjusting possibility:

The two oscillatory circuits are tuned for the same frequency. In FIG. 10, this is shown by the two solid resonance curves 64, 65. By symmetrical interference on closing the sliding door, the resonance curves are shifted for both oscillatory circuits as the result of the capacitance increasing to the left into the dashed positions 65', 65'.

With non-symmetric interference which is shown in FIG. 11, the resonance frequency 65 of the associated oscillatory circuit will on interference with the lower electrode 7 move toward the left hand side and the oscillator will stop swinging. Corresponding action will be obtained when interference affects the upper electrode 6 (not shown).

2nd adjusting possibility:

The two oscillatory circuits should be adjusted slightly offset as shown in FIG. 12 so that an amplitude 66 of medium size is produced at the collector of the transistor 29.

If non-symmetric interference occurs at electrode 7, the resonance frequency 65 of the lower oscillatory circuit will move to the left and the oscillation will stop. This is shown schematically in FIG. 13.

If non-symmetric interference occurs at electrode 6, the resonance frequency 64 of the associated oscillatory circuit will move to the left and a high amplitude 67 will be produced at the collector of transistor 29. This is shown schematically in FIG. 14.

Since, subsequently, both a positive and a negative direct voltage is produced in the amplifier formed by the switching elements 26 to 32, the negative direct voltage will exceed the Zener diode voltage of 46 and operate the amplifier 48.

The second adjusting possibility affords a higher sensitivity than the first but it is more difficult to adjust.

I claim:

1. A field sensor control mechanism for detecting obstructions in front of the leading edges of linearly moving motor-operated sliding elevator doors, comprising at least two insulated electrodes mounted in a leading edge of a slidable door at different levels; means, including a first capacitor and a first inductor, forming a first oscillating circuit electrically connected to one of said electrodes; means, including a second capacitor and a second conductor, forming a second oscillating comparison circuit electrically connected to the other of said electrodes and having a base oscillating frequency at least substantially the same as that of said first circuit; and means including a feedback winding and an amplifier connected in circuit with said first and second circuits and operative for so coupling said first and second circuits that the oscillations of said first circuit vary as a function of capacitance changes in said electrodes.

2. A mechanism as defined in claim 1, wherein said first capacitor is a variable capacitor.

3. A mechanism as defined in claim 1, wherein said feedback winding includes a potentiometer.

4. A mechanism as defined in claim 1; and further comprising auxiliary amplifier means operatively connected with said first and second circuits for amplifying the oscillations thereof.

5. A mechanism as defined in claim 4; further comprising an operational amplifier; and a pair of rectifier circuits receiving output signals from said auxiliary amplifier and each supplying to said operational amplifier a rectified input signal having a negative and a positive polarity, respectively.

6. A mechanism as defined in claim 1; and further comprising resistor means in circuit with said oscillating circuits and operative for determining the initial switch-on time and the restarting switch-on time of the mechanism as a function of the leading edge reaching the end of its movement to an open position.

7. A mechanism as defined in claim 1, wherein said circuits have slightly different base oscillating frequencies.

8. A mechanism as defined in claim 1, wherein said circuits have identical base oscillating frequencies.

9. A mechanism as defined in claim 1, wherein said circuits have slightly different base oscillating frequencies and wherein movements of the leading edge are controlled as a function of the absence of oscillations and of increased amplitude of oscillations, respectively.

10. A mechanism as defined in claim 1, wherein said circuits have identical base oscillating frequencies and wherein movements of said leading edge are controlled as a function of the presence of oscillations and the absence of oscillations, respectively.

* * * * *